United States Patent [19]
Frei

[11] Patent Number: 5,942,766
[45] Date of Patent: Aug. 24, 1999

[54] ARTICLE AND METHOD FOR IN-PROCESS TESTING OF RF PRODUCTS

[75] Inventor: Michel R. Frei, Berkeley Heights, N.J.

[73] Assignee: Lucent Technologies, Inc., Murray Hill, N.J.

[21] Appl. No.: 08/932,001

[22] Filed: Sep. 17, 1997

[51] Int. Cl.[6] .................................................. H01L 23/544
[52] U.S. Cl. ............................................. 257/48; 257/620
[58] Field of Search ............................... 257/620, 48, 797

[56] References Cited

U.S. PATENT DOCUMENTS

| | | | |
|---|---|---|---|
| 3,849,872 | 11/1974 | Hubacher | 29/574 |
| 5,059,899 | 10/1991 | Farnworth et al. | 257/48 |
| 5,206,181 | 4/1993 | Gross | 437/8 |
| 5,214,657 | 5/1993 | Farnworth et al. | 257/202 |
| 5,504,369 | 4/1996 | Dasse et al. | 257/48 |

Primary Examiner—David B. Hardy

[57] ABSTRACT

A wafer configured for in-process electrical testing is disclosed. According to the invention, a single RF-device monitor is disposed partially in a first street and partially in a second street orthogonal to the first street, between four adjacent dies present on a wafer. With such an arrangement, streets having a width of 100 microns and less are suitable for accomodating a RF-device monitor having a ground-signal configuration. As a result, less space is sacrificed for device monitors than in prior art wafers, thereby increasing the amount of wafer area available for circuitry.

14 Claims, 5 Drawing Sheets

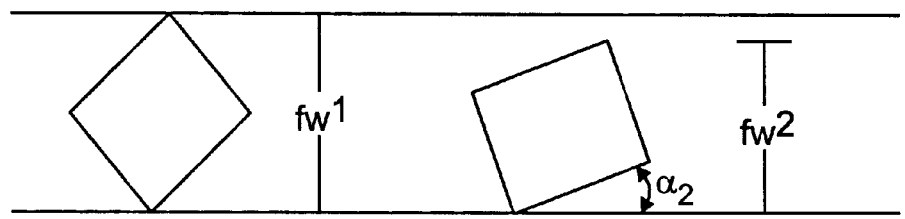
FIG. 6
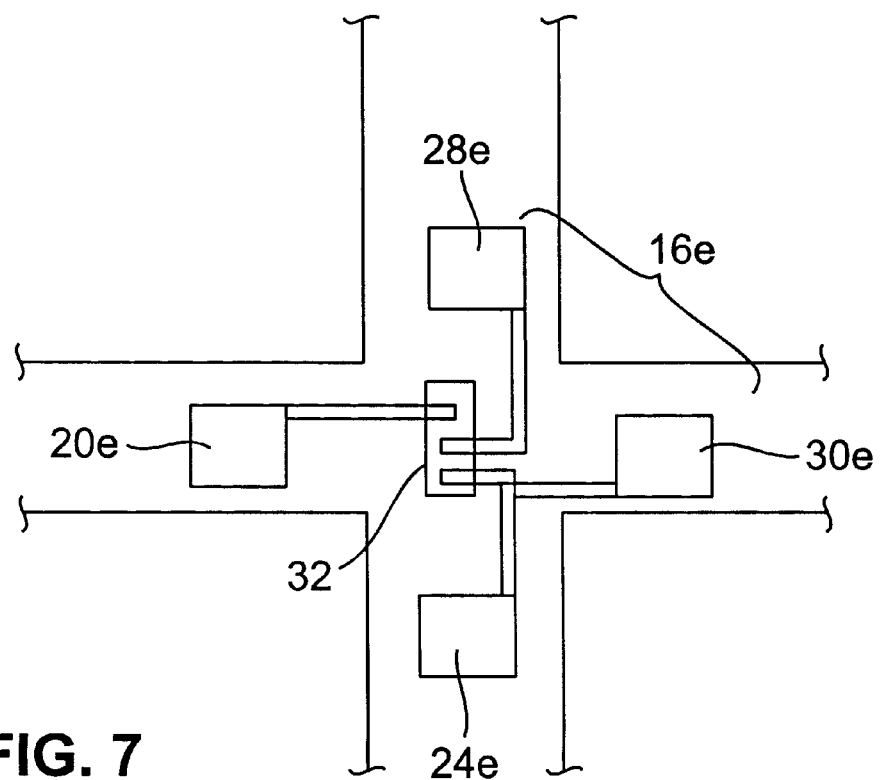
FIG. 7
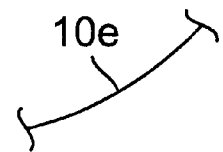

ARTICLE AND METHOD FOR IN-PROCESS TESTING OF RF PRODUCTS

FIELD OF THE INVENTION

The present invention relates to in-process electrical testing of integrated circuit components.

BACKGROUND OF THE INVENTION

Integrated circuits (ICs) formed on semiconductor substrates, typically silicon wafers, are typically comprised of a variety of basic electrical components, such as amplifiers, resistors and the like. It is desirable to verify that such integrated basic components are fabricated according to a design specification and have certain properties or values, e.g., a specified gain, resistance, etc. An individual component cannot readily be tested, however, once integrated into a circuit.

In lieu of testing the integrated components, "stand-alone" copies of such basic components are tested. The stand-alone copies are fabricated in either vertical or horizontal "streets" that separate various "dies," i.e., integrated circuits, formed on the wafer. Such copies have properties or values of gain, resistance, etc. that are representative of such properties of their "integrated" counterparts since they are fabricated using the same processes. As such, it is appropriate to apply the test results to the integrated components. The aforedescribed quality control methodology is referred to as "in-process electrical testing."

During in-process electrical testing, a signal source and measurement device, usually external, are electrically connected to the stand-alone component to be tested ("the target component"). Electrical connection is effected via microprobes, one of which is attached to an end of a coaxial cable carrying a signal from the signal source, the other of which probes is attached to an end of a coaxial cable leading to the measurement device. On the wafer, the target component is electrically connected to pads. The microprobes contact the pads thereby electrically connecting the signal source and the measurement device to the target component.

The pads and the target component collectively form a "process monitor" or "device monitor" or tester. Some of the wafer surface is reserved for such monitors. Such reserved surface cannot be utilized for devices forming part of the ICs, and, as such, reduces the amount of wafer surface available for the ICs. It is therefore desirable to reduce the amount of wafer surface sacrificed in conjunction with the use of such process monitors.

SUMMARY OF THE INVENTION

According to the present invention, a first portion of a single device monitor for high frequency measurement (RF-device monitor) is disposed in a vertical street and a second portion of the RF-device monitor is disposed in a horizontal street between any four dies present on a wafer. On conventional wafers, a single device monitor is wholly disposed in either a vertical street or a horizontal street, not partially in a vertical street and partially in a horizontal street.

Apportioning the elements of a device monitor in accordance with the present invention allows for the use of narrower streets than if the monitor is disposed wholly in a horizontal or vertical street. Thus, the area required for accommodating an RF-device monitor on the present wafer is less than that required for prior art wafers having conventionally-arranged RF-device monitors. In particular, assuming each die is about 10 millimeters (mm) square, the area sacrified to such RF-device monitors on the present wafer is about two percent of the wafer area, as compared to about 3 to 4 percent of the wafer area for conventional wafers.

BRIEF DESCRIPTION OF THE FIGURES

FIG. 6 shows a two examplary pads, one rotated 45 degrees and the other rotated 15 degrees; and FIG. 7 shows a portion of a third exemplary wafer according to the present invention, wherein a RF-device monitor having un-tilted pads is located partially in a vertical street and partially in a horizontal street.

DETAILED DESCRIPTION OF THE INVENTION

The present invention is directed to a wafer configured for in-process electrical testing, at high frequencies (RF), of electrical components situated thereon. Before describing the present invention, it is useful to discuss prior art wafers and the manner in which RF-device monitors are arranged thereon for in-process electrical testing.

Figure 1:
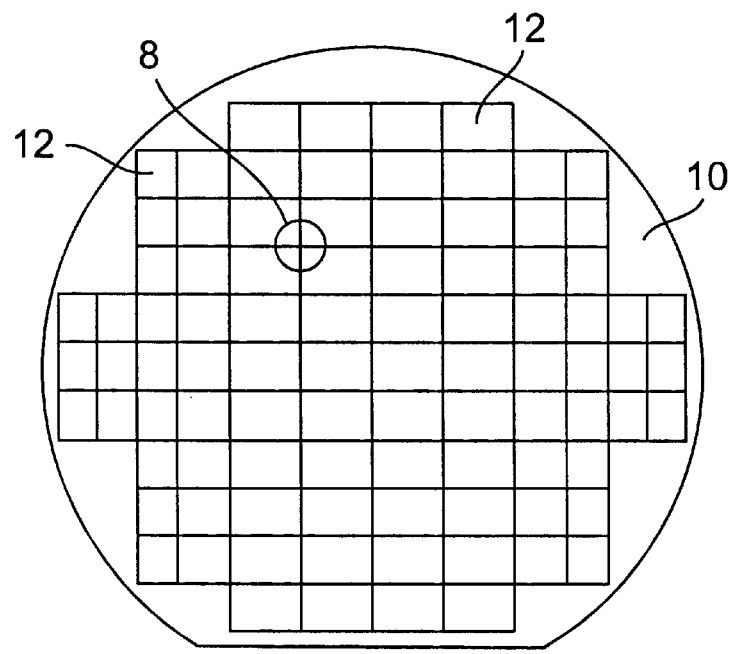
FIG. 1 shows a conventional prior art wafer, having a plurality of dies arranged thereon.

FIG. 1 shows a conventional wafer 10, and a plurality of dies 12 formed thereon. For the purposes of the present specification, the dies 12 are defined as discrete regions of the wafer at which circuitry is patterned. Such circuitry may be appropriate for use in any number of intended applications, the details of which circuits and applications are unimportant for describing the present invention. All dies resident on a wafer may contain the same circuitry, such as is typical for mass production of a particular IC. Alternatively, each die in a plurality of such dies disposed on a single wafer may have a different circuit configuration from other dies on the wafer. Typically, the wafer is diced to separate the dies 12 for use. When separated, the individual dies are typically referred to as an "IC" or a "chip."

Figure 2:
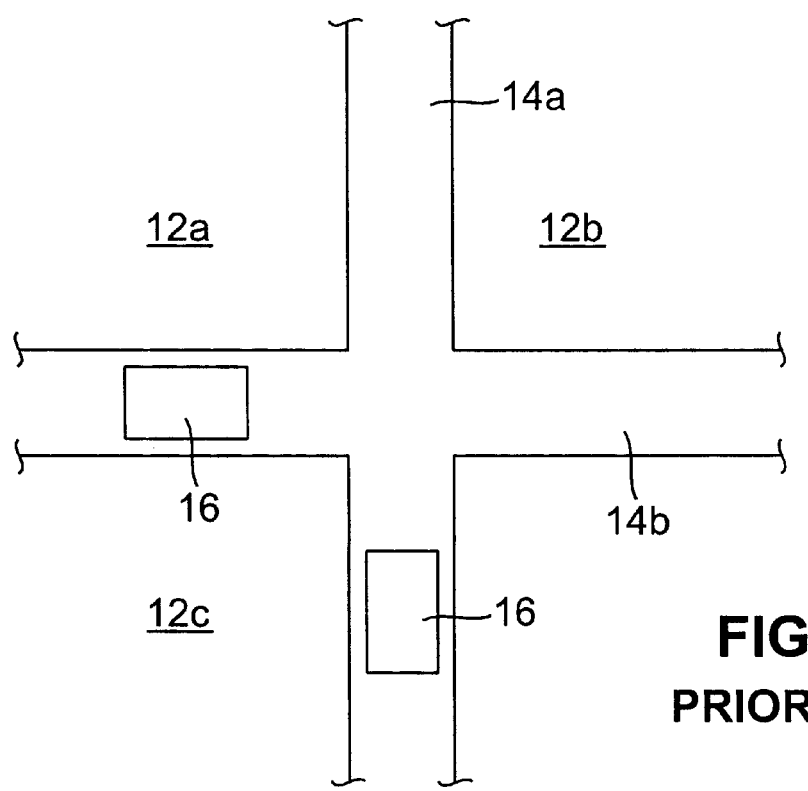
FIG. 2 shows an enlarged view of a region of the wafer of FIG. 1, showing horizontal and vertical streets located between dies.

As shown in FIG. 2, which is an enlargement of region 8 of the wafer 10 of FIG. 1, adjacent dies, such as the dies 12a and 12b, and 12a and 12c, are separated by respective vertical and horizontal streets 14a, 14b. Device monitors 16 operable to test various stand-alone electrical components, counterparts of which stand-alone components are incorporated within the circuits comprising any of the dies 12 on the wafer 10, are located in the streets between such dies, such as the streets 14a, 14b.

Device monitors can be classified according to their operating frequency range. One class of device monitors is suitable for DC or relatively low frequency measurements, such as below about 1 megaHertz (MHz). A second class of device monitors is suitable for high frequency, i.e., radio frequency (RF) measurements. The second class of device monitors (RF-device monitors) is appropriate for measurements at frequencies as high as about 40 gigaHz (GHz) for "ground-signal" configurations and as high as about 60 GHz for "ground-signal-ground" configurations.

The present invention is directed to a wafer for in-process electrical testing using the ground-signal configuration of RF-device monitors. Such monitors require more space on the wafer than low frequency device monitors, but less than ground-signal-ground RF-device monitors. For example, a conventional wafer might utilize streets having a width of about 100 microns to accomodate low frequency device monitors, streets having a width of about 200 microns for ground-signal RF-device monitors and streets having a width of about 300 microns for ground-signal-ground RF-device monitors. In such conventional wafers, all RF-device monitors on a wafer are usually disposed in one of either the vertical streets or horizontal streets. Disposing all of the RF-device monitors only on one type of street generally minimizes the area sacrificed to such monitors since the streets (vertical or horizontal) that do not accomodate the monitors can be narrower than those that do.

Figure 3:
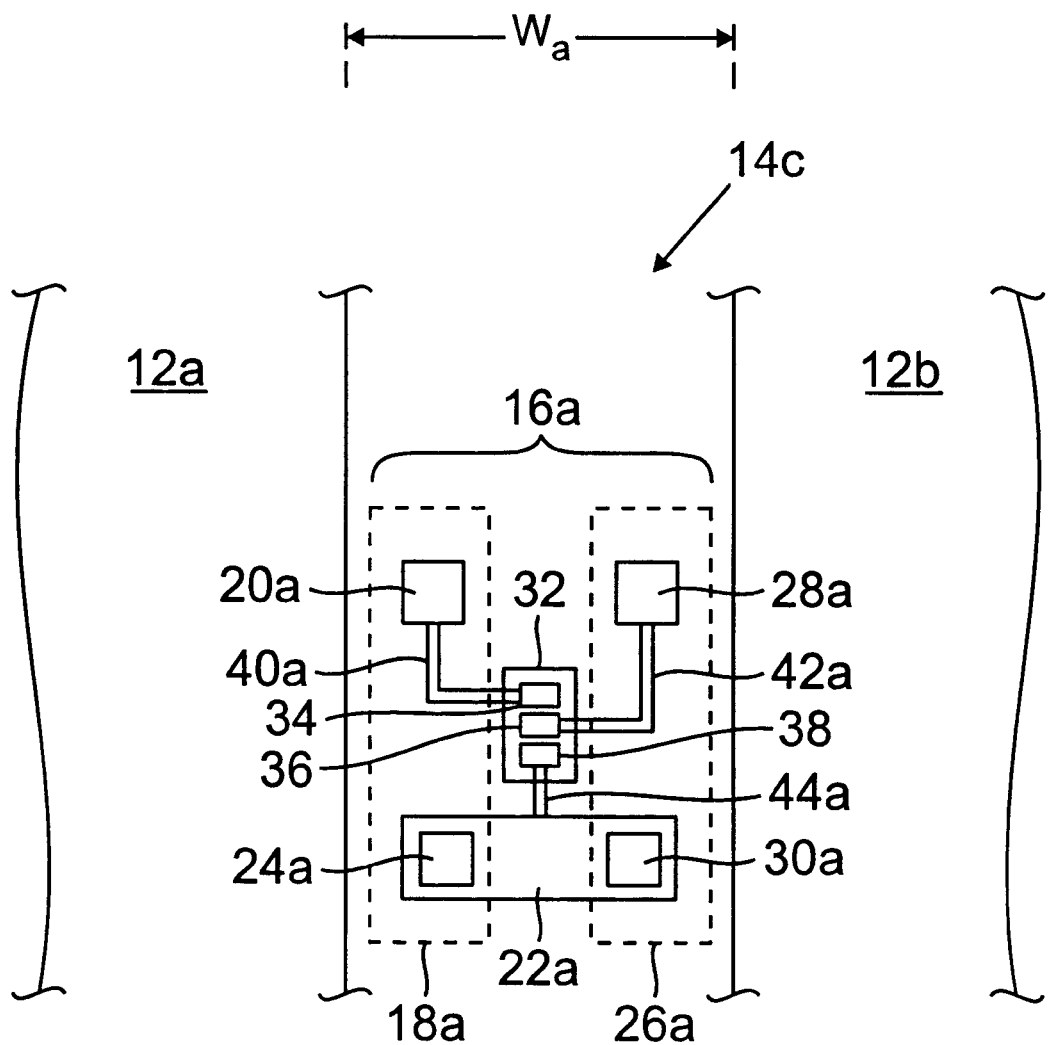
FIG. 3 shows a first prior art wafer with an RF-device monitor located in a vertical street between the dies.

High frequency, i.e., RF, measurement of a stand-alone electrical component is performed by measuring power transfer between an input port and output port having a common ground. A portion of a conventional wafer 10a with ground-signal RF-device monitor 16a disposed in vertical street 14c is shown in FIG. 3. The ground-signal RF-device monitor 16a includes input port 18a and output port 26a. The input port 18a comprises an input signal pad 20a and input probe grounding region 24a of common ground 22a. The output port 26a comprises an output signal pad 28a and output probe grounding region 30a of common ground 22a. The input signal pad 20a, output signal pad 28a and common ground 22a are discrete regions of conductive material, such as, without limitation, metal, disposed on the wafer 10a. It should be understood that respective input and output probe grounding regions 24a and 30a are figurative or conceptual features of the common ground 22a. It is not necessary for such regions to be otherwise distinguishable from any other region of the common ground 22a.

The ground-signal RF-device monitor 16a further includes a component 32 to be tested ("the target component."). The target component 32 may be any component that is incorporated into circuits residing on that wafer. Typically, a plurality of such device monitors 16a, each including a different target component 32, or including the same type of target component but each having a different characteristic value, e.g., gain, resistance, and the like, are disposed on a wafer, such as the wafer 10a.

The target component 32 is connected to the input and output ports 18a, 26a, as shown in FIG. 3. A first conductive trace 40a electrically connects a target component input 34 to the input signal pad 20a. A second conductive trace 42a electrically connects a target component output 36 to the output signal pad 28a. A third conductive trace 44a electrically connects a target component ground 38 to the common ground 22a.

Thus, the ground-signal RF-device monitor 16a includes the input port 18a, output port 26a, the target component 32 and the three conductive traces 40a, 42a and 44a. As is illustrated in FIG. 3, the RF-device monitor 16a has a "co-planar" arrangement wherein the ground 22a and signal pads 20a, 28a are located on the same surface of the wafer 10a. The addition of a second ground on the other side of the signal pads 20a, 28a in FIG. 3 would provide a ground-signal-ground configuration to the RF-device monitor. As previously noted, the present invention is directed to RF-device monitors having a ground-signal configuration.

To measure the target component 32, a high frequency signal source, such as a microwave generator and detector, not shown, are electrically connected to the target component, as follows. A first coaxial cable, not shown, carrying a high frequency signal from the high frequency signal source, is terminated by a first input "co-planar" microprobe, not shown. Co-planar microprobes suitable for use with ground-signal RF-device monitors, such as the monitors 16a, have two arms. One of the arms of the first microprobe contacts the input signal pad 20a, and the other arm contacts the input probe grounding region 24a. A second coaxial cable, not shown, is connected to the detector. The second coaxial cable is terminated by a second co-planar microprobe having two arms. One of the arms of the second microprobe contacts the output signal pad 28a and the other arm contacts the output probe grounding region 30a.

The input and output signal pads 20a, 28a are typically about 60–80 microns square. Typically, the approach distance between the first input and the second output microprobe, when in contact with the respective input and output ports 18a, 26a, should be at least about 100 microns to minimize electrical coupling therebetween. Allowing about 10–15 microns between the right edge of the die 12a and the left edge of the input signal pad 20a (and common ground 22a), and the same distance between the left edge of the die 12b and the right edge of the output signal pad 28a (and common ground 22a), requires a street width, $w_a$, of at least about 200 microns for the vertical street 14c.

As will be appreciated by those skilled in the art, it is preferable that ports comprising a device monitor, such as the device monitor 16a shown in FIG. 3, are not colinear. A colinear arrangement of such ports may introduce undesirable spurious effects such as unwanted inductance or reflections.

Figure 4:
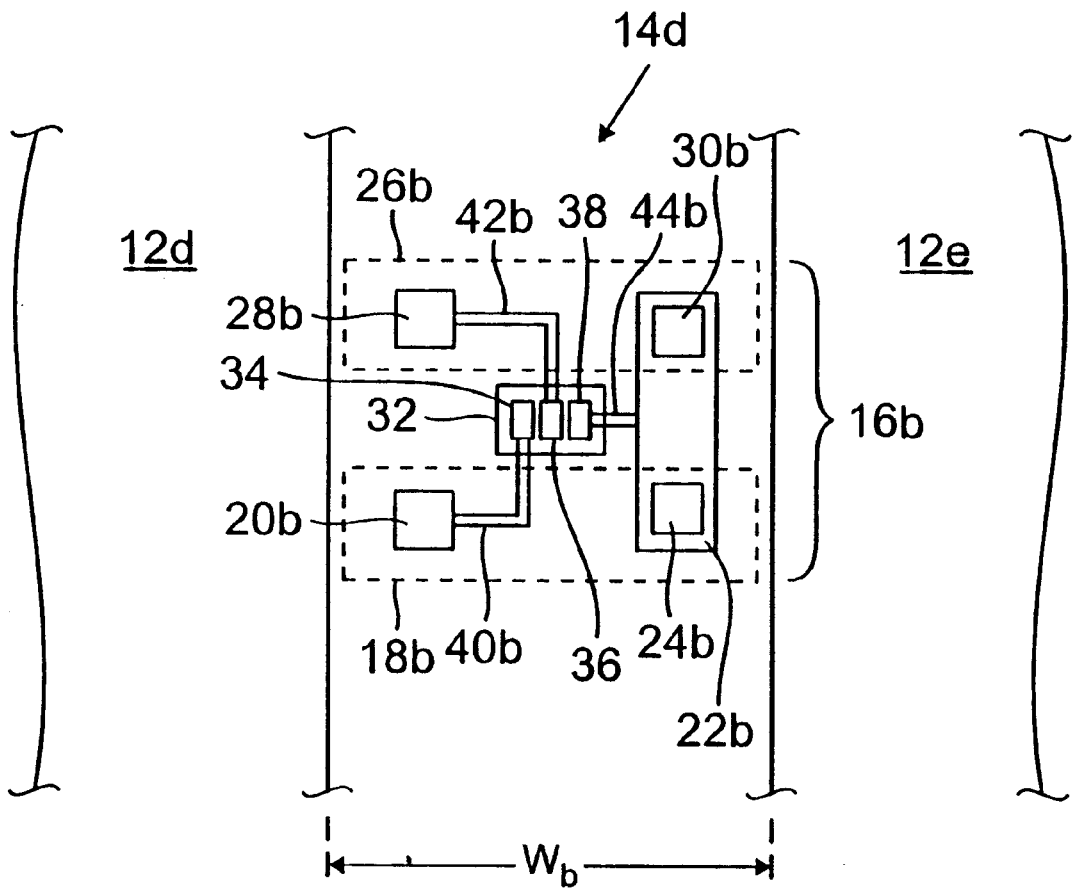
FIG. 4 shows a second prior art wafer with an RF-device monitor located in a vertical street between the dies.
Figure 4:
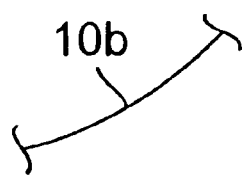

FIG. 4 shows a second embodiment of a prior art wafer 10b wherein a ground-signal RF-device monitor 16b is located within a vertical street 14d between dies 12d and 12e. The ground-signal RF-device monitor 16b includes all the same elements, e.g., input and output ports, etc., as the monitor 16a of FIG. 3. The monitor 16b has, however, a different orientation in the street than the monitor 16a. In particular, the monitor 16b is rotated ninety degrees relative to the monitor 16a. As before, during target device testing, one arm of the input (output) microprobe contacts the input (output) signal pad 20b (28b), and the other arm of either microprobe contacts the common ground 22b. On the wafer 10b, the width $w_b$ of a vertical street 14d accomodating ground-signal device monitor 16b is controlled by the distance between the arms of the microprobe, rather than the approach distance between the input and output microprobe, as for the vertical street 14c on the wafer 10a (FIG. 3). The minimum distance between such probe arms is about 75–100 microns. Thus, the width $w_b$ of the vertical street 14d is a minimum of about 200 microns, the same as for the previous embodiment.

The RF-device measurement is prone to several sources of error, some of which have already been described. Additional sources of error include insertion losses due to the coaxial cable-microprobe connections, as well as reflections due to impedance mismatches along the connection path. Accurate measurement requires low-loss, well-matched and reproducible connection between the measurement instrumentalities (high frequency signal source and detector) and the target device 32. Such error is minimized by proper dimensioning of the ground-signal RF-device monitor, such as the monitors 16a, 16b, and further through the use of the appropriate co-planar microprobe. Such dimensioning, spacing and selection, some of which is quantified above, is within the capabilities of those skilled in the art. Co-planar microprobes suitable for use in conjunction with the present invention are available from Cascade Microtech, Inc. of Beaverton, Oreg., and GGB Industries of Naples, Fla., among others.

Having described conventional wafers configured for in-process electrical testing, the present invention is now described. In a wafer according to the present invention, ground-signal RF-device process monitors may be advantageously accommodated in streets having a width of only about 100 microns and less. While the ground-signal RF-device monitors used in conjunction with the present invention may, in some embodiments, have a somewhat different configuration than the monitors 16a and 16b used in conjunction with prior art wafers, they incorporate all the same elements as the device monitors 16a and 16b.

The aforementioned reduction in street width is accomplished by locating a ground-signal RF-device monitor at the intersection of two streets such that the monitor is partially in a first street and partially in a second street orthogonal to the first street. For example, the monitor can be disposed partially in a vertical street 14e and partially in a horizontal street 14f located between dies 12f–12i located on wafer 10c, as illustrated in FIG. 5.

Figure 5:
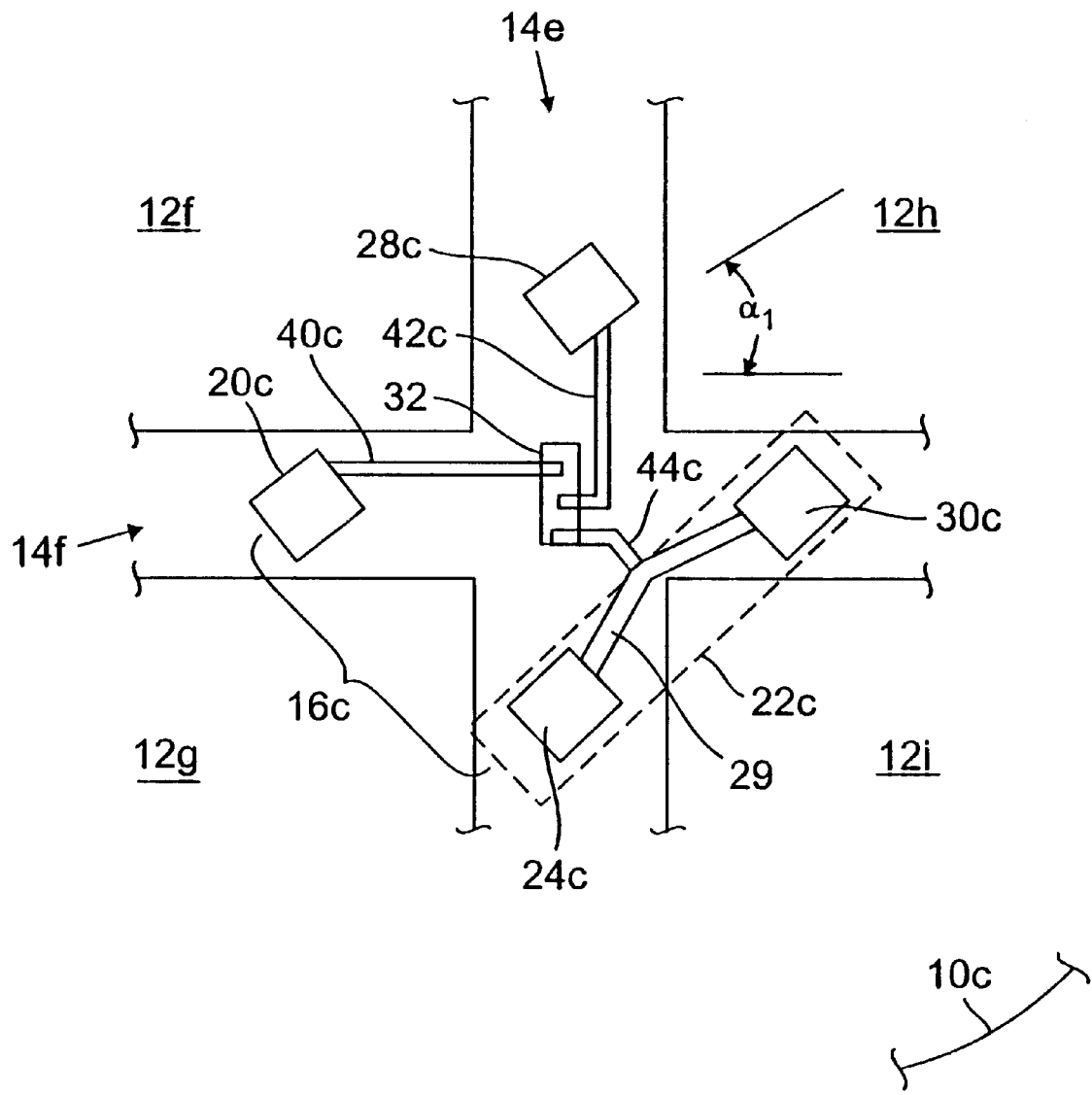
FIG. 5 shows a portion of a first exemplary wafer according to the present invention, wherein a RF-device monitor having pads tilted 45 degrees is located partially in a vertical street and partially in a horizontal street.

In the embodiment illustrated in FIG. 5, the input signal pad 20c, output signal pad 28c and common ground 22c of ground-signal RF-device monitor 16c are rotated by an angle $\alpha_1$ of about forty-five degrees relative to axes defined by the horizontal and vertical streets. When arranged in such a manner, the RF-device process monitor 16c can be read by a standard "off-the-shelf" co-planar microprobe. When a RF-device monitor, such as the process monitor 16c, is being tested, it is typically placed on a stage, not shown. Either the microprobes or the wafer 10c are rotated until the proper alignment between the microprobes and the various pads 20c, 28c and common ground 22c is obtained, e.g., 45° rotation of the microprobes or the wafer 10c for a ground-signal RF-device monitor 16c rotated by 45° degrees. It will be appreciated that the conductive traces 40c, 42c and 44c that electrically connect the target device 32 to the various pads in the device monitor 16c may be routed differently than the conductive traces 40a–44a and 40b–44b of respective device monitors 16a and 16b located on respective conventional wafers 10a, 10b (FIGS. 3 & 4). Additionally, the "footprint" of the common ground 22c may be somewhat different than that of the common grounds 22a, 22b. In particular, the input and output probe grounding regions 24c, 30c are now implemented as discrete regions distinguishable from other regions of the common ground 22c, such as a region 29 which provides electrical connection between the regions 24c and 30c.

Assuming that the input and output signal pads 20c, 28c, and the input and output probe grounding regions 24c, 30c have a width of about 55–60 microns, the forty-five degree rotation of the pads dictates that the pad footprint has a maximum width of 55–60 ($\sqrt{2}$)≈80 microns. Providing about 10 microns minimum between the pads and the dies 12f–12i results in a street width $w_c$ of about 100 microns.

In a second embodiment of a wafer according to the present invention, the input and output signal pads 20c, 28c, and the input and output probe grounding regions 24c, 30c are rotated by an arbitrary amount other than forty-five degrees. As shown in FIG. 6, rotating the pads by an angle $\alpha_2$ different than forty-five degrees reduces the width of the footprint of the pad. For example, footprint width $fw^2$ of a pad rotated by 15° is less than the footprint width $fw^1$ of a pad rotated by 45°. This allows for a narrower street than in the previously described embodiment of the present invention. If rotated by an angle $\alpha_2$ other than forty-five degrees, however, a non-standard microprobe may be required for measurement since such a rotation tends to increase spacing between the signal pads 20c, 28c and also between the grounding regions 24c and 30c. The development of such a non-standard probe as part of a particular wafer fabrication project is often performed and is within the capabilities of those skilled in the art.

FIG. 7 shows a third embodiment of a wafer 10e according to the present invention wherein the input and output signal pads 20e, 28e, and the input and output probe grounding regions 24e, 30e are not rotated. Of the three embodiments of the present invention shown in FIGS. 5–7, the third embodiment allows for the smallest street width. The ground-signal RF-device monitor 16e of FIG. 7 has the most nonstandard configuration, however. As such, it may be desirable to fabricate a single probe "card" that possesses four arms for contacting the input and output ports. Such fabrication is within the capabilities of those skilled in the art.

In FIGS. 5 & 7, respective input signal pads 20c, 20e are disposed in horizontal streets, and output signal pads 28c, 28f are disposed in vertical streets. Locating the pads in that manner is strictly for the purposes of illustration; it should be understood that input signal pads may alternatively be disposed in vertical streets and output signal pads may be disposed in horizontal streets.

In the embodiments of the present invention shown in FIGS. 5–7, the signal pads and the grounding regions were shown to have a square or rectangular shape. In other embodiments, a device monitor can be configured with signal pads and grounding regions having other shapes, e.g., octagonal, circular, etc. It will be appreciated that for such embodiments, the aforedescribed rotation of the pads and grounding regions by some angle, e.g., 45°, 30° or the like, will not yield the aforedescribed advantages. It should be clear, however, that the present invention can be practiced with device monitors incorporating pads and grounding regions having such other shapes by locating a first portion of the such a device monitor in a vertical street and a second portion in a horizontal street.

Although specific embodiments of this invention have been described herein, it is to be understood that these embodiments are merely illustrative of the principles of this invention. Numerous and varied modifications may occur to, and be implemented by, those of ordinary skill in the art in view of the present teachings without departing from the scope and the spirit of the invention.

I claim:

1. A wafer configured for in-process testing of electrical components, comprising:
    a plurality of dies disposed on the wafer, wherein adjacent dies are separated from one another by streets, wherein a first group of the streets is substantially orthogonal to a second group of the streets; and
    a device monitor having a first and a second port, wherein the device monitor is placed at an intersection of a street from the first group and a street from the second group such that at least a portion of the first port is placed in the street from the first group and at least a portion of the second port is placed in the street from the second group.

2. The wafer of claim 1, wherein at least one of the dies is an electrical circuit comprised of electrical components, and wherein the device monitor further comprises a first electrical component electrically connected to the first port and the second port, wherein the first electrical component is similar to one of the electrical components comprising the electrical circuit.

3. The wafer of claim 1, wherein the device monitor is a RF-device monitor with ground-signal configuration.

4. The wafer of claim 3, wherein a street selected from the first group of streets has a first width of less than about 150 microns, and a street selected from the second group of streets has a width of less than about 150 microns.

5. The wafer of claim 4, wherein a street selected from the first group of streets has a first width of about 100 microns, and a street selected from the second group of streets has a width of about 100 microns.

6. The wafer of claim 3, wherein the input port comprises an input signal pad and an input probe grounding pad, and the output port comprises an output signal pad and an output probe grounding pad, and further wherein the first and the second groups of streets define a first and a second axis, wherein the input and output signal pads, and the input and output probe grounding pads are oriented in an in-plane, non-orthogonal direction relative to both the first and second axes.

7. The wafer of claim 6, wherein the input and output signal pads, and the input and output probe grounding pads are oriented at about forty-five degrees relative to the first and the second axes.

8. A wafer configured for in-process electrical testing, comprising:

at least four physically separated integrated circuits disposed on the wafer and arranged so that each of the four dies has two sides adjacent to two other dies, and wherein the dies are separated by a first street and a second street, wherein the first street is substantially orthogonal to the second street; and a device monitor having a first and a second port, wherein the device monitor is placed at an intersection of the first street and the second street such that at least a portion of the first port is placed in the first street and at least a portion of the second port is placed in the second street.

9. The wafer of claim 8 wherein the device monitor is a RF-device monitor with ground-signal configuration.

10. A method for forming a wafer configured for in-process electrical testing, the wafer having a plurality of dies disposed on the wafer, wherein adjacent dies are separated from one another by streets, wherein a first group of the streets is substantially orthogonal to a second group of the streets, comprising the steps of:

forming a device monitor at an intersection of a street from the first group and a street from the second group such that a first portion of the device monitor is formed in the street from the first group and a second portion of the device monitor is formed in the street from the second group.

11. The method of claim 10, wherein the step of forming further comprises the steps of:

forming an input port, a portion of which is formed in the street from the first group; and forming an output port, a portion of which is formed in the street from the second group.

12. The method of claim 11, wherein the steps of forming an input port and forming an output port further comprises the step of forming a common ground, a first portion of which is formed in the street from the first group and a second portion of which is formed in a street from the second group.

13. The method of claim 10, wherein the step of forming a device monitor further comprises the step of forming an electrical component for testing.

14. The method of claim 13, wherein the step of forming a device monitor further comprises the step of forming electrical connections between the electrical component and the input port and the output port.

* * * * *